(12) United States Patent
Yazdi

(10) Patent No.: US 7,562,573 B2
(45) Date of Patent: Jul. 21, 2009

(54) INTEGRATED SENSOR AND CIRCUITRY AND PROCESS THEREFOR

(75) Inventor: Navid Yazdi, Ann Arbor, MI (US)

(73) Assignee: Evigia Systems, Inc., Ann Harbor, MI (US)

( * ) Notice: Subject to any disclaimer, the term of this patent is extended or adjusted under 35 U.S.C. 154(b) by 53 days.

(21) Appl. No.: 11/458,729

(22) Filed: Jul. 20, 2006

(65) Prior Publication Data

US 2007/0029629 A1 Feb. 8, 2007

Related U.S. Application Data

(60) Provisional application No. 60/701,300, filed on Jul. 21, 2005.

(51) Int. Cl.
*G01P 15/125* (2006.01)

(52) U.S. Cl. .................. 73/514.32; 73/514.18; 361/280

(58) Field of Classification Search ............. 73/514.18, 73/514.32; 361/280
See application file for complete search history.

(56) References Cited

U.S. PATENT DOCUMENTS

| | | | |
|---|---|---|---|
| 5,345,824 A * | 9/1994 | Sherman et al. .......... 73/514.18 |
| 5,610,335 A | 3/1997 | Shaw et al. |
| 6,277,666 B1 | 8/2001 | Hays et al. |
| 6,291,875 B1 * | 9/2001 | Clark et al. ............... 257/622 |
| 6,313,529 B1 * | 11/2001 | Yoshihara et al. .......... 257/724 |
| 6,701,788 B2 | 3/2004 | Babala |
| 6,718,605 B2 | 4/2004 | Yazdi et al. |
| 6,868,726 B2 * | 3/2005 | Lemkin et al. ............ 73/514.32 |
| 7,337,671 B2 * | 3/2008 | Ayazi et al. .............. 73/514.32 |
| 2004/0065638 A1 | 4/2004 | Gogoi |

OTHER PUBLICATIONS

Frank Niklaus, Sjoerd Haasl, and Goran Stemme; "Arrays of Monocrystalline Silicon Micromirrors Fabricated Using CMOS Compatible Transfer Bonding"; Journal of Microelectromechanical Systems, vol. 12, No. 4, Aug. 2003, pp. 465-469.

Navid Yazdi, Haluk Kulah and Khalil Najafi; "Precision Readout Circuits for Capacitive Microaccelerometers"; Center of Wireless Integrated Microsystems, IEEE 2004.

(Continued)

*Primary Examiner*—John E Chapman
(74) *Attorney, Agent, or Firm*—Hartman & Hartman, PC.; Gary M. Hartman; Domenica N.S. Hartman

(57) ABSTRACT

A micromachined sensor and a process for fabrication and vertical integration of a sensor and circuitry at wafer-level. The process entails processing a first wafer to incompletely define a sensing structure in a first surface thereof, processing a second wafer to define circuitry on a surface thereof, bonding the first and second wafers together, and then etching the first wafer to complete the sensing structure, including the release of a member relative to the second wafer. The first wafer is preferably a silicon-on-insulator (SOI) wafer, and the sensing structure preferably includes a member containing conductive and insulator layers of the SOI wafer. Sets of capacitively coupled elements are preferably formed from a first of the conductive layers to define a symmetric capacitive full-bridge structure.

27 Claims, 14 Drawing Sheets

OTHER PUBLICATIONS

Kei Ishihara, Chi-Fan Yung, Arturo A. Ayon and Martin A. Schmidt; "An Inertial Sensor Technology Using DRIE and Wafer Bonding with Interconnecting Capability"; Journal of Microelectromechanical Systems, vol. 8, No. 4, Dec. 1999, pp. 403-407.

Mark Lemkin and Bernhard E. Boser; "A Three-Axis Micromachined Accelerometer with a CMOS Position-Sense Interface and Digital Offset-Trim Electronics"; IEEE Journal of Solid-State Circuits, vol. 34, No. 4, Apr. 1999, pp. 456-467.

Michel Despont, Ute Drechsler, R. Yu, H.B. Pogge and P. Vittiger; "Wafer-Scale Microdevice Transfer/Interconnect: Its Application in an AFM-Based Data-Storage System"; Journal of Microelectromechanical Systems, Vol. 13, No. 6, Dec. 2004, pp. 895-901.

Navid Yazdi and Khalil Najafi; "An Interface IC for A Capacitive Silicon ug Accelerometer"; 1999 IEEE International Solid-State Circuits Conference; Session 7; Paper TA 7.2.

J. Kijhamaki, H. Ronkainen, P. Pekko, H. Kattelus and K. Theqvist; "Modular Integration of CMOS and SOI-MEMS Using "Plug-Up" Concept"; 12th International Conference on Solid State Sensors, Actuators and Microsystems, Boston, Jun. 8-12, 2003.

* cited by examiner

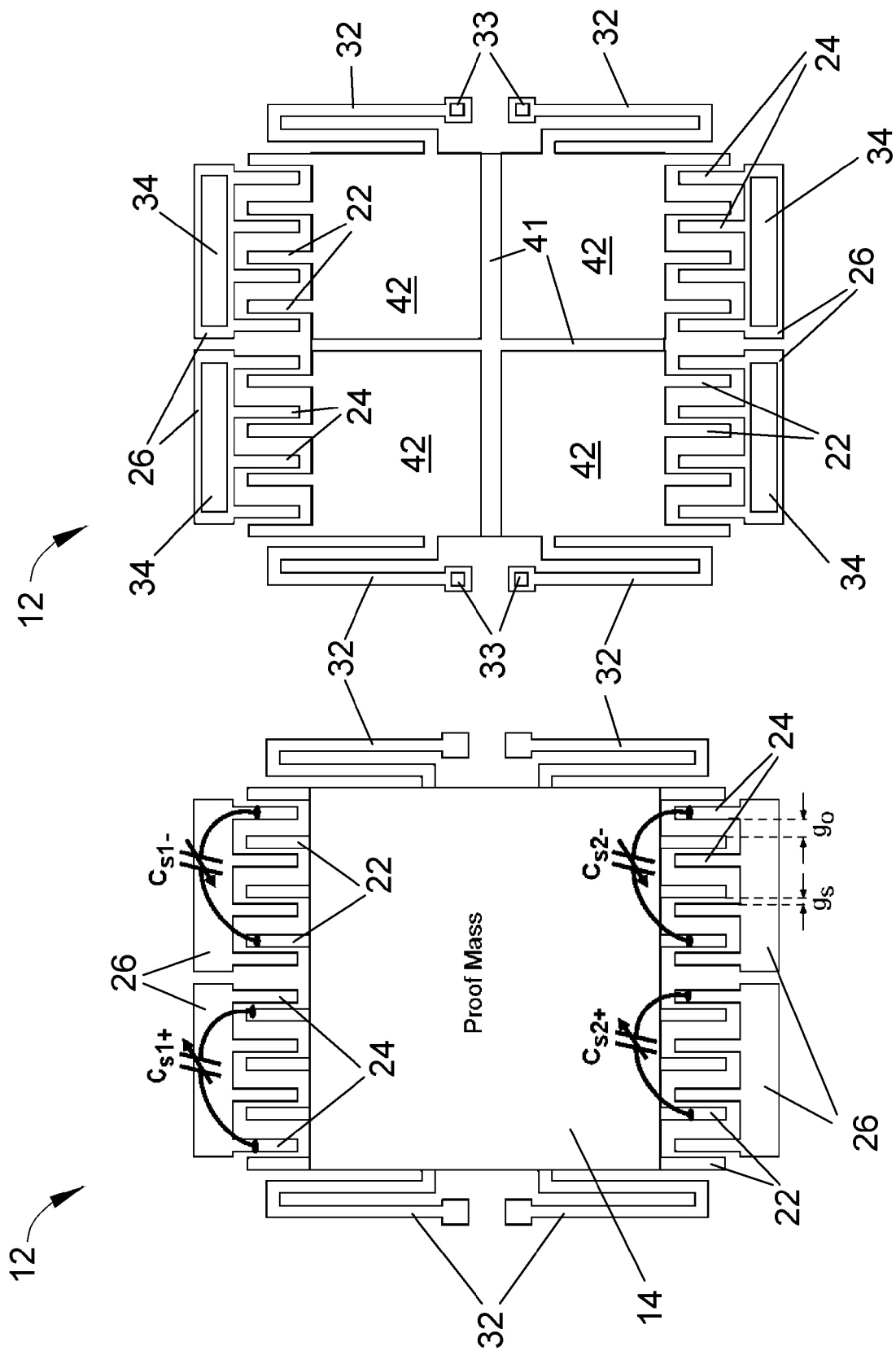

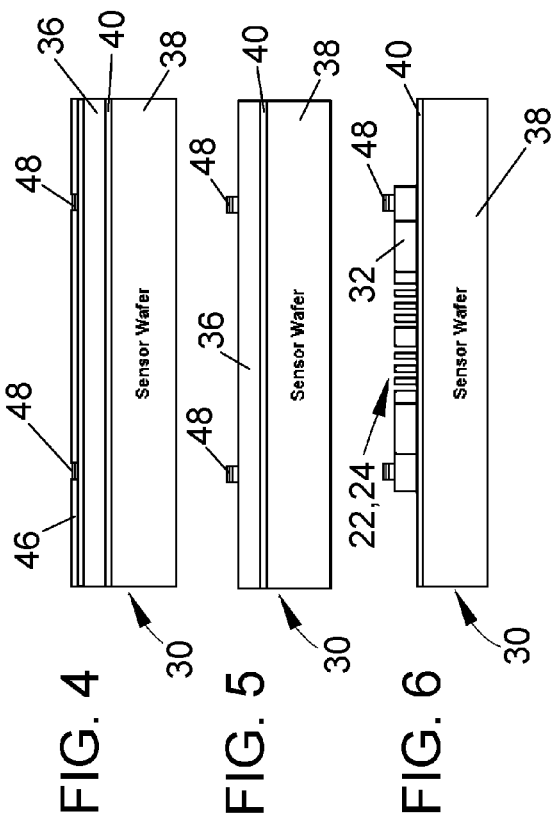
FIG. 4
FIG. 5
FIG. 6
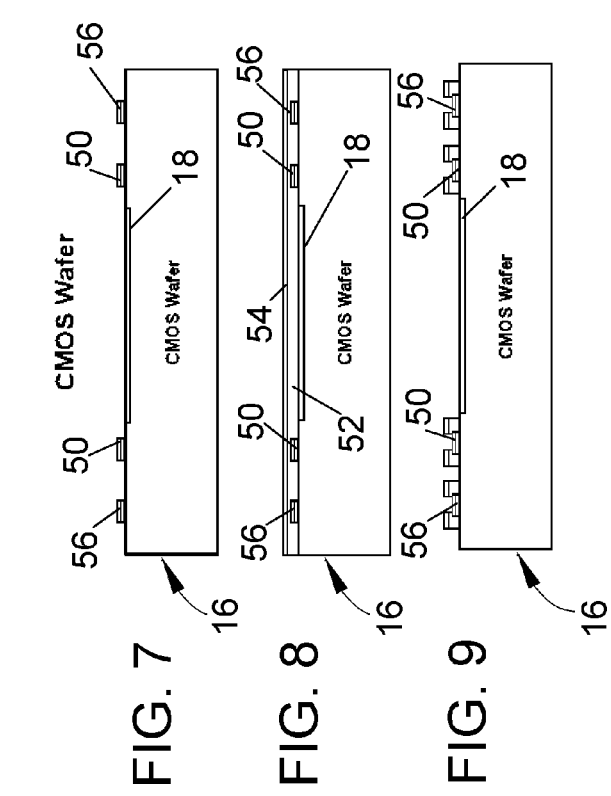
FIG. 7
FIG. 8
FIG. 9
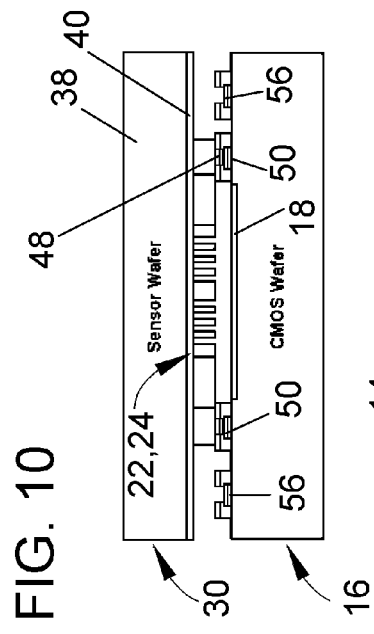
FIG. 10
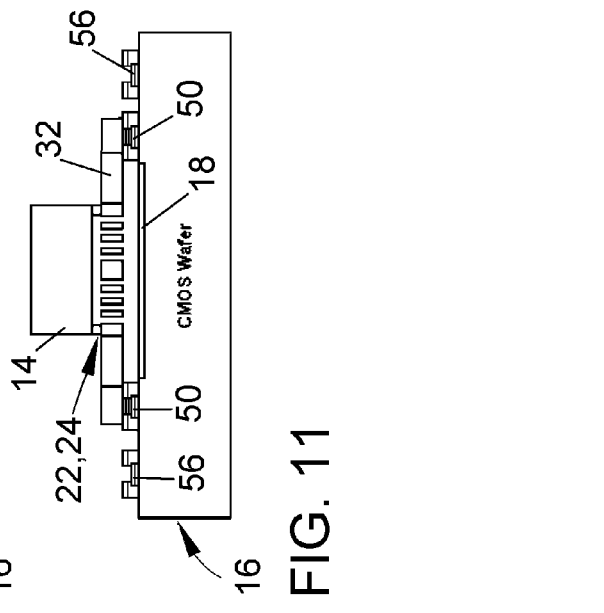
FIG. 11

FIG. 15
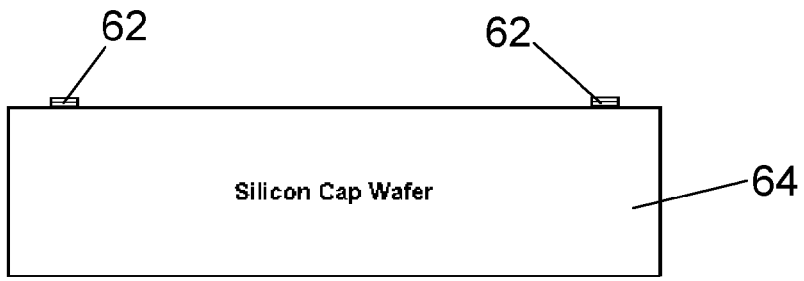
FIG. 16
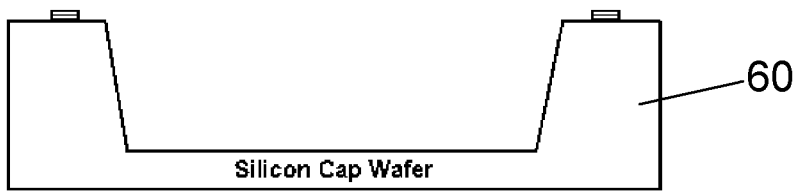
FIG. 17
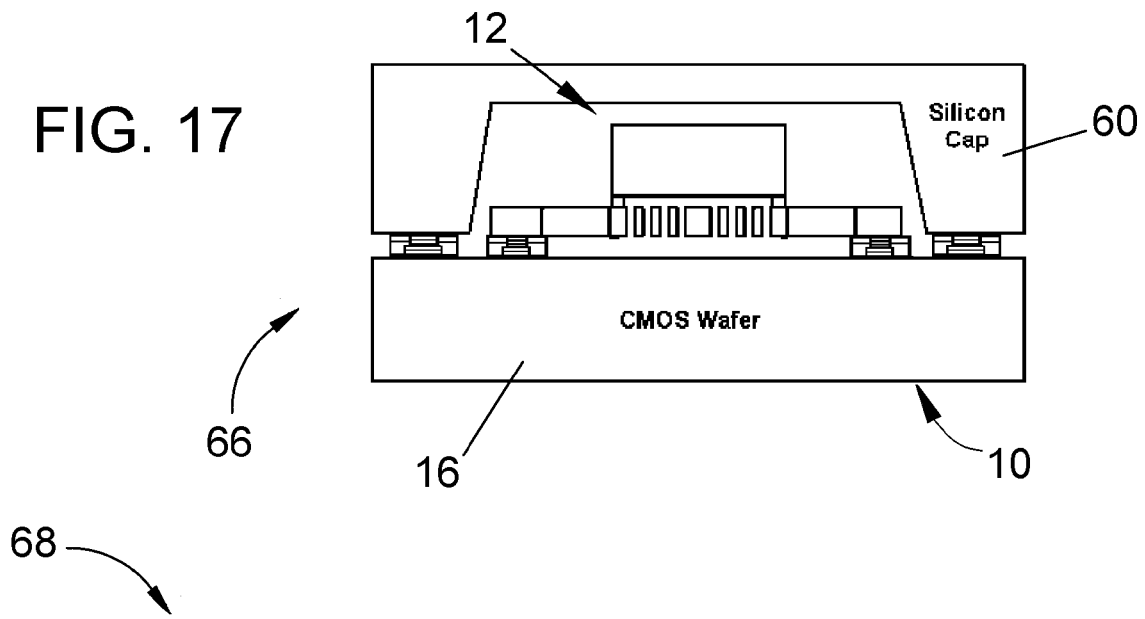
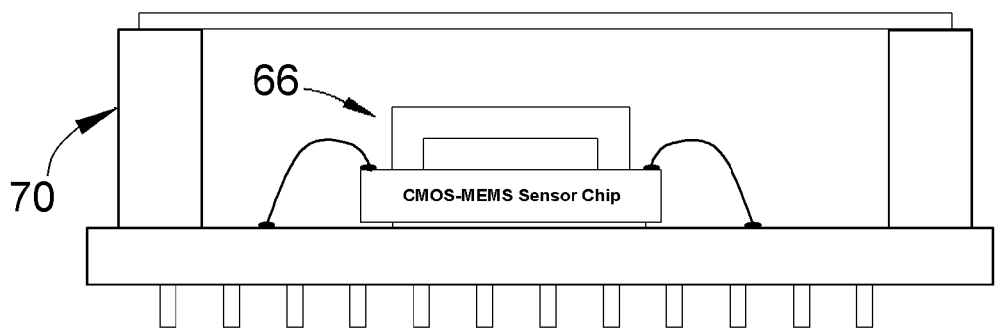
FIG. 18

INTEGRATED SENSOR AND CIRCUITRY AND PROCESS THEREFOR

CROSS REFERENCE TO RELATED APPLICATIONS

This application claims the benefit of U.S. Provisional Application No. 60/701,300, filed Jul. 21, 2005, the contents of which are incorporated herein by reference.

BACKGROUND OF THE INVENTION

The present invention generally relates to micromachined semiconductor sensors and their fabrication. More particularly, this invention relates to a sensor comprising a capacitive sensing device capable of exhibiting large mechanical sensitivity and integration with circuitry to reduce input parasitics and improve the overall signal-to-noise ratio. The invention also relates to a manufacturing process by which such a sensing device and circuitry associated therewith can be fabricated on separate substrates prior to their integration.

Motion sensors in the form of microelectromechanical system (MEMS), including accelerometers, are widely used in aerospace and automotive safety control systems and navigational systems, consumer goods such as VCR cameras, as well as other mass-volume applications in which both performance and miniaturization is highly desirable and sometimes necessary. Capacitive micro-accelerometers have the combined advantages of high sensitivity, good direct current (dc) response and noise performance, low drift, low temperature sensitivity, low power dissipation, and large readout bandwidth as compared to high sensitivity tunneling and resonant devices. High sensitivity in capacitive accelerometers is attained in part by using a wafer-thick large proof mass. The first generation of these devices used multiple wafer bonding to form the proof mass and electrodes. More recently, capacitive accelerometers have been fabricated using a combined surface-bulk micromachining process to form the device on a single silicon wafer, such that the micromachined accelerometer is advantageously monolithically fabricated with the interface circuit. All of these devices are hybrid packaged with the interface circuitry, and as such are characterized by relatively large parasitics. A large capacitive sensitivity is generally used to compensation for the relatively high electrical noise floor caused by the parasitics. However, the proof mass of a surface micromachined accelerometer is typically small, which results in lower sensitivity and a mechanical noise floor of typically tens to hundreds of micro-g's.

In view of the above, it would be advantageous if a capacitive micro-accelerometer could be fabricated that provides both large mechanical sensitivity and integration with CMOS circuitry to reduce input parasitics and improve the overall signal-to-noise ratio. In addition, it would also be desirable if such a device and its fabrication process could be achieved with reduced manufacturing and packaging cost for use in mass-volume applications.

BRIEF SUMMARY OF THE INVENTION

The present invention provides a micromachined sensor and process for its fabrication, in which the sensor is capable of large mechanical sensitivity and integration with circuitry to reduce input parasitics and improve the overall signal-to-noise ratio of the sensor.

According to a first aspect of the invention, a process is provided by which a micromachined sensor is formed to comprise a sensing structure and circuitry electrically coupled to the sensing structure. The process includes processing a first wafer to incompletely define the sensing structure in a first surface thereof, processing a second wafer to define the circuitry on a surface thereof, bonding the first and second wafers together, and then etching the first wafer to complete the sensing structure by removing portions of the first wafer at a second surface thereof opposite the first surface to define a member and by removing portions of the first wafer at the first surface thereof to release the member relative to the second wafer.

According to a second aspect of the invention, a micromachined sensor is provided having a capacitive sensing structure that includes a member comprising first and second conductive layers and a buried insulator layer separating the first and second conductive layers. A first set of elements is defined with the first conductive layer and comprises at least first and second elements that are electrically isolated from each other on the member by the buried insulator layer. A second set of elements is capacitively coupled with the first set of elements with gaps therebetween, and the capacitive couples generate capacitive outputs that vary with changes in the gaps.

According to a preferred but optional aspect of the invention, the first and second sets of elements define a symmetric capacitive full-bridge structure, with elements of the first set of elements being electrically insulated from each other by the insulator layer. According to another preferred but optional aspect of the invention, the micromachined sensor comprises interface circuitry that includes means for performing multiple correlated double sampling of input thereto and output thereof, and means for performing chopper stabilization that reduces dc and low-frequency noise and drift.

In view of the above, it can be seen that the sensor and process of this invention are applicable to a variety of MEMS structures, including accelerometers and other motion sensors. The invention can also be extended to sensing units with multiple sensors, such as integrated three-axis accelerometers and gyroscopes, and multiple-layer bonding for other MEMS structures such as micro-mirrors. The manner by which the process of this invention provides for vertical integration of a sensor and circuitry makes possible an integrated sensor of very small die size with multiple low-parasitics local leads between the sensor and its circuitry, which also simplifies packaging and reduces costs. The conductor-insulator-conductor (e.g., a silicon-on-insulator) construction employed by the micromachined sensor facilitates the fabrication of the preferred symmetric capacitive full-bridge structure, which enables precision readout without need for reference capacitors. By interdigitating the first and second elements to have relatively large opposed sensing surface separated by narrow air gaps, high capacitive sensitivity and a low mechanical noise floor can be achieved even when subjected to atmospheric pressures.

Other objects and advantages of this invention will be better appreciated from the following detailed description.

BRIEF DESCRIPTION OF THE DRAWINGS

FIGS. 2 and 3 are top and bottom vies of an accelerometer sense element of the motions sensor of FIG. 1.

FIGS. 4 through 11 represent steps in the fabrication of the motion sensor of FIG. 1.

FIGS. 15 through 17 represent steps of a wafer-level packaging process for the motion sensor of FIG. 1.

FIG. 18 represents the motion sensor packaged within a sensor module.

DETAILED DESCRIPTION OF THE INVENTION

Figure 1:
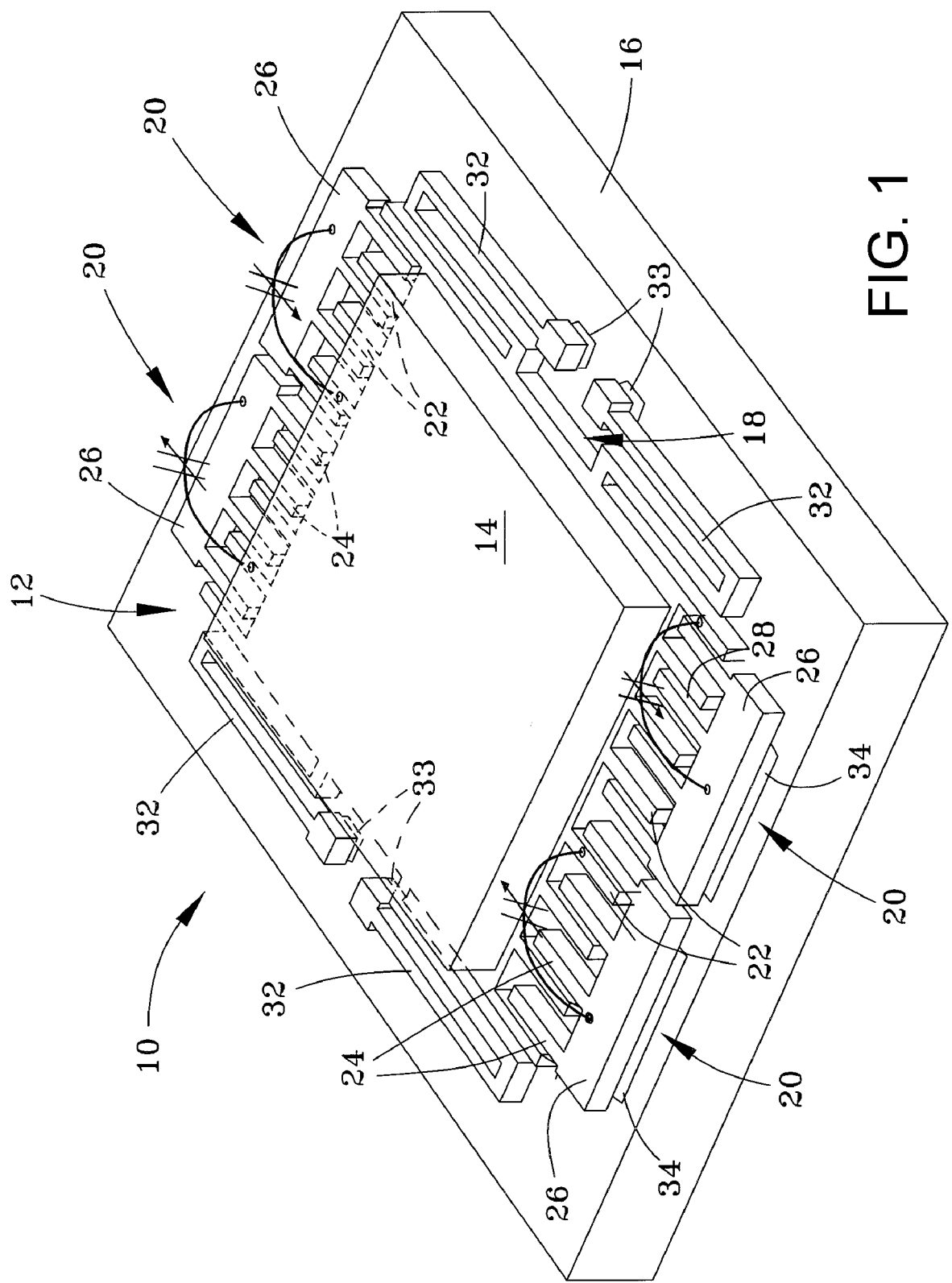
FIG. 1 schematically represents a perspective view of a motion sensor comprising an integrated accelerometer and interface circuitry in accordance with the present invention.

FIG. 1 is a perspective view of a sensor device 10 in accordance with an embodiment of the invention. As represented in FIG. 1, the sensor device 10 is a microelectromechanical system (MEMS) comprising a capacitive sensing element 12 supported above a substrate 16. Circuitry 18 (preferably CMOS interface circuitry) for the sensing element 12 is present on the substrate 16, preferably beneath the sensing element 12 as indicated in FIG. 1, though optionally on a surface region of the substrate 16 surrounding the element 12. The sensing element 12 includes a proof mass 14 with an in-plane axis of sensitivity, i.e., the plane of sensitivity is substantially parallel to the surface of the substrate 16. The sensing element 12 is preferably responsive to lateral motion or acceleration, though capacitive sensing for other purposes is also within the scope of this invention. As such, while the invention will be described with particular reference to a capacitive acceleration sensor device 10, the invention also encompasses other MEM's sensors and actuators. The relative sizes of structural components of the sensor device 10 are for illustrative purposes only.

The mechanical structure of the sensor device 10, including the sensing element 12 and its supporting substrate 16, is preferably fabricated from single-crystal silicon, whose very stable mechanical characteristics promote higher sensor stability and manufacturing yield. The proof mass 14 is shown as being suspended over the substrate 16 with support beams 32 that generally limit the proof mass 14 to bidirectional movement. The beams 32 are shown having a folded configuration that enables the beams 32 to exhibit high stability over a wide temperature range. The folded support beams 32 have the further advantage of not being affected by limited residual thermo-mechanical stresses induced by dielectric and metal layers of the CMOS process on the substrate 16. However, it should be understood that the proof mass 14 could be supported with other forms of suspension, including straight support beams to achieve lower cross-axis sensitivity.

Sensing and feedback electrodes 20 electrically couple the sensing element 12 to the interface circuitry 18 on the substrate 16. As evident from FIG. 1, the electrodes 20 comprise pairs of interdigitated fingers 22 and 24, one set of which extends from the proof mass 14 while the second set extends from anchors 26 on the substrate 16. As schematically represented in FIG. 1, the fingers 22 and 24 are capacitively coupled in groups, with four isolated capacitive coupled groups ($C_{s1+}$, $C_{s1-}$, $C_{s2+}$, $C_{s2-}$) being represented, though different numbers of capacitive couples are also within the scope of the invention. As represented in FIG. 1, the interdigitated fingers 22 and 24 form a symmetrical full-bridge structure that helps to lower any potential residual effects of thermo-mechanical stresses in the substrate 16. The support beams 32 of the proof mass 14 include bond pads 33 that provide electrical interconnection between the proof mass 14, proof mass fingers 22 and the substrate 16, as will be discussed in more detail in reference to FIGS. 2 and 3. Electrical connections between the fixed fingers 24 and the substrate 16 are provided with bonding pads 34 formed beneath the anchors 26 by metal bonds, which do not adversely impact device performance due to their rigid connection to the substrate 16. According to a preferred aspect of the invention, the fingers 22 and 24 are thick (e.g., a few micrometers to several hundred micrometers) and separated by relative narrow air gaps 28 (e.g., submicron to a few micrometers). To obtain their desired dimensions, the fingers 22 and 24 and air gaps 28 therebetween are preferably defined by front-side high aspect ratio deep reactive ion etching (DRIE), as will be discussed in more detail below.

Fabrication of the sensing element 12 is completed after integration with the substrate 16 on which the CMOS interface circuitry 18 was previously fabricated to achieve a high-yield batch CMOS-MEMS manufacturing process. In particular, the sensing element 12 is initially fabricated on a separate sensor wafer 30 (FIGS. 4 through 6), and the proof mass 14 is formed and released by a final etch step after bonding the sensor wafer 30 to the substrate 14, such as with a low-temperature wafer bonding process. The vertical integration of the sensing element 12 and its circuitry 18 made possible with the present invention provides multiple low-parasitic leads between the sensing element 12 and circuitry 18, achieved through the electrical interconnections formed by the anchors 26 and beams 32 located in close proximity to the interface circuitry 18 on the substrate 16. The vertical integration of the sensing element 12 and its circuitry 18 also provides the potential for reducing the size of the device 10, simplify packaging, and reduce cost. Consecutive multiple wafer bonds and release etches can be used to form multilevel MEM's structures in combination with the sensing element 12 and CMOS substrate 14.

The following describes the sensor device 10 in greater detail, with particular goals including the achievement of high capacitive sensitivity, low-mechanical noise floor, low cross-axis sensitivity, and low temperature sensitivity while minimizing the overall die size and maintaining a high-yield fabrication process. As noted above, the sensor device 10 uses a capacitive sense scheme, which has the advantage of good dc response, high-sensitivity, low-noise, and low-temperature drift. The static open-loop sensitivity of a capacitive accelerometer can be calculated as follows:

$$\Delta C_{static}/a = N(\epsilon_0 A m)/(g_s^2 k) = N(\epsilon_0 A)/(g_s^2 \omega_r^2)$$

where $\Delta C_{static}$ is the sensor capacitance change, a is the input acceleration, N is the number of pairs of fingers 22 and 24, $\epsilon_0$ is the permittivity of air, A is the sense area per paired fingers 22 and 24, m is the mass of the proof mass 14, $g_s$ is the width of the air gap 28, k is the spring constant of the beams 32, and $\omega_r$ is the mechanical self-resonance frequency of the sensing element 12. Mechanical noise is caused by the Brownian motion of the gas molecules surrounding the proof mass 14 and the Brownian motion of the proof mass support beams 32. The Total Noise Equivalent Acceleration (TNEA rms-[m/sec²/Hz$^{1/2}$]) can be calculated by:

$$TNEA=(4K_BTD)^{1/2}/m=(4K_BT\omega_r)^{1/2}$$

where $K_B$ is the Boltzmann constant, T is temperature in Kelvin, D is the damping factor, and Q is the quality factor. When not in a low-pressure ambient, squeeze film damping is the dominant regime for parallel fingers 22 and 24 whose widths and lengths are significantly larger than the air gap 28. Squeeze film damping can be calculated based on the geometries and the surrounding gas viscosity (μ). For instance, the damping factor (D) for N pairs of interdigitated fingers 22 and 28 having lengths of L and thicknesses of T, and separated by an air gap 28 of $g_s$ is given by:

$$D=0.427N\mu T^3L/g_s^3=0.427N\mu AT^2/g_s^3$$

The above three equations indicate that the targeted high-performance of the capacitive acceleration sensing device 10 of this invention simultaneously requires formation of a large, thick proof mass 14, soft suspension beams 32, narrow air gaps 28 over a large sense area, and small damping, all of which are achieved with the sensing device 10 represented in FIG. 1.

In addition to the benefits noted above, the symmetric capacitive full-bridge structure formed by the interdigitated fingers 22 and 24 is able to directly interface with a fully-differential readout front-end circuit (FIG. 14) without any need for reference capacitors. The full-bridge structure also improves the overall sensitivity of the sensor device 10 and lowers drift including temperature sensitivity. However, the fingers 22 and 24 require multiple isolated leads to provide for the multiple sense capacitors indicated in FIG. 1. While not possible in commonly used MEMS accelerometer structures in which a proof mass forms a common sense-capacitance node, a notable advantage of the sensor device 10 and fabrication process of this invention is the capability of simultaneously providing isolated sense capacitors and a full capacitance bridge. This aspect of the invention is more readily evident from FIGS. 2 and 3, which represent top and bottom views, respectively, of the sensing element 12, its fingers (sensor fingers) 22, and the fingers (fixed fingers) 24 on the substrate 16 interdigitated with the fingers 22. This aspect of the invention will also be discussed in reference to FIGS. 4 through 6, which show the sensing element 12 (including the fingers 22 and 24, anchors 26, and beams 32) as being fabricated from a silicon-on-insulator (SOI) wafer 30. The sensor fingers 22 extending from the proof mass 14 are formed by etching a first conductive (device) layer 36 of the wafer 30, which is separated from a second conductive (handle) layer 38 of the wafer 30 by an insulative buried oxide layer 40. As previously noted, the sensor fingers 22 (and fixed fingers 24) are preferably formed by front-side high aspect ratio etching to have thicknesses of a few micrometers to several hundred micrometers, and air gaps 28 with widths as little as submicron size to a few micrometers. The thicker handle layer 38 of the wafer 30 is subsequently used to define the proof mass 14. Because the device and handle layers 36 and 38 are electrically isolated from each other by the buried oxide layer 40, trenches 41 can be etched in the device layer 36 during the same step used to define the sensor fingers 22 to delineate leads 42 on the lower surface of the proof mass 14 that are electrically isolated on the proof mass 14 by the buried oxide layer 40, as shown in FIG. 4. With this arrangement, four groups of paired sets of fingers 22 and 24 are shown as being defined and electrically insulated from each other by the buried oxide layer 40. As evident from FIG. 3, the buried oxide layer 40 structurally delineates a symmetrical full-bridge structure that is formed by the interdigitated fingers 22 and 24 and whose line of symmetry passes along an exposed portion of the buried oxide layer 40, passes through the center of the proof mass 14, and separates the beams 32 on the same side of the proof mass 14. The finger gaps 28 are asymmetrical ($g_0 > g_s$ in FIG. 2) to provide a net capacitance change when the proof mass 14 and its fingers 22 are displaced relative to the fixed fingers 24. For $g_0 > 4g_s$, the capacitance sensitivity is reduced by only about 6% compared with the case where a sensing element is formed by two parallel plates separated by a gap of $g_s$.

While a cross-shaped trench 41 is depicted in FIG. 3, it should be understood that one or more trenches with various shapes could be defined in the device layer 36 to electrically separate each lead 42 and its respective fingers 22 from the other leads 42 and their respective fingers 22. Furthermore, the trenches could be configured to minimize the size of the leads 42 for the purpose of minimizing the buildup of charge within the leads 42. Finally, trenches could also be etched in the proof mass 14 to define proof mass portions coinciding with the leads 42, and then each proof mass portion electrically coupled (e.g., with conductive vias) to their respective leads 42 to reduce the buildup of charge within the proof mass 14.

The cross-axis sensitivity of the sensor device 12 can be minimized by proper spring geometry design (including the use of straight support beams 32) and reducing the distance between the center of gravity of the proof mass 14 and the plane of the beams 32 by optimizing the ratio of the thickness of the proof mass 14 to the height of the beams 32. This entails increasing the height of the beams 32 (and sensor fingers 22 and 24), which increases the sensitivity of the device 10 as well. However, increased beam and finger thickness also increases damping and mechanical noise, as evident from the second and third equations above. As such, an optimal design can be obtained by adjusting the air gap 28 while maintaining the mechanical and electrical noise floor low.

From the foregoing, it is evident that the sensor device 10 of this invention is adapted to operate at atmospheric ambient pressures (and higher). Those skilled in the art will appreciate that higher sensitivity and resolution can be achieved by vacuum packaging the sensor device 10. However, suitable performance for the sensor device 10 is believed to be very likely achievable without the need for vacuum packaging. The sensor device 10 of this invention is therefore capable of avoiding the higher costs and more demanding sealing requirements associated with vacuum micropackaging processes. Nevertheless, higher sensitivity and resolution sensors obtainable by vacuum packaging is an optional aspect of the invention.

The fabrication and manufacturing process for the sensor device 10 will now be more fully described in reference to FIGS. 4 through 11. As previously discussed, the preferred sensor fabrication process is fully compatible with post-CMOS processing, and enables the sensing element 12 to be formed and integrated with its CMOS interface circuitry 18. Preferred fabrication steps are also batch processes that can be performed at wafer level, and their combination is a high-yield process that can be performed in a standard MEMS fabrication facility. These aspects of the invention provide notable advantages over standard process technology used in high-sensitivity MEMS accelerometer manufacturing FIGS. 4 through 6 represent preferred fabrication steps for the sensing element 12, in which two masking steps are performed on the SOI sensor wafer 30. Preferred thicknesses for the device and handle layers 36 and 38 of the wafer 30 are about 5 to about 200 μm and about 300 to about 600 μm, respectively, though it should be understood that other thicknesses could be employed. In FIG. 4, a plating seed layer 44 has been deposited over which a photo resist material is deposited and patterned to form a mold 46 in which bonding metal stacks 48 are electroplated. Alternatively, depending on the type of bond to be used, suitable bonding sites can be formed using other deposition processes (e.g., metal evaporation, sputtering, etc.), or by silkscreening or printing to form bond sites for polymer-based bonds, or patterning, masking, and exposing suitable bond sites to an electrical field or ions prior to field-assisted bonding. The mold 46 and portions of the plating seed layer 44 beneath the mold 46 are then removed (FIG. 5), followed by patterning and etching the device layer 36 with a high aspect ratio DRIE silicon etch to form the interdigitated fingers 22 and 24, anchors 26, and suspension beams 32 and yield the structure shown in FIG. 6. The backside of the sensor wafer 30 may also be patterned at this time (e.g., using a silicon oxide or nitride mask) for subsequent use during etching of the proof mass 14 (FIG. 11).

FIGS. 7 through 9 represent fabrication steps for the substrate 16, referred to at this process level as the CMOS wafer 16, in which the interface circuitry 18 has already been fabricated. Processing of the wafer 16 also has two masking steps, the first of which involves depositing and patterning metal stacks for use as bonding pads 50. Suitable metal layers for the bond pads 50 include nickel and gold, though it is foreseeable that other materials could be used. The pads 50 contact the CMOS pads (not shown), which will later provide electrical connection between the sensing element 12 and the interface circuitry 18. As represented in FIG. 8, hard and soft polyimide layers 52 and 54 may optionally be spun and baked on the surface of the wafer 16 and subsequently patterned to yield structures for containing the bond pads 50 as shown in FIG. 9. FIGS. 7 through 9 also depict a metal bonding ring 56 for a package cap 60 (FIGS. 15 through 17) as having also been formed on the CMOS wafer 16. The polyimide layers 54 and 56 provide a mold for metal TLP or solder bonding of the package cap 60 to the sensor device 10. The top soft layer 56 provides compliance and allows the application of pressure during bonding to improve the bonding yield for CMOS and sensor wafers 16 and 30 having dissimilar radii of curvature. The soft layer 56 can be removed from the process if the radius of curvature difference is small.

The third and final series of preferred steps include a single masking step. The sensor wafer 30 is flipped and aligned with the bond pads 50 on the CMOS wafer 16. Slight pressure is then applied while the wafers 16 and 30 are bonded to yield the structure shown in FIG. 10. Preferred bonding temperatures depend on the bonding scheme and materials, though generally it is believed that temperatures below 420° C., and particularly below 380° C., are compatible with the CMOS wafer 16. The CMOS and sensor wafers 16 and 30 can be bonded using various low-temperature bonding schemes, including but not limited to transient liquid phase (TLP) bonding, metal-metal thermo-compression bonding, solder bonding, eutectic bonding, glass frit bonding, ion-assisted wafer bonding, field-assisted bonding, polymer/epoxy based bonding, etc. As known in the art, a TLP bond is formed between a thin metal interlayer having a relatively low melting temperature and a parent metal with a higher melting temperature. At the bond temperature, the metal interlayer melts, flows to the parent metal, and is completely consumed by the parent metal to form an intermetallic compound having a higher melting temperature than the bond temperature. The higher melting temperature of the intermetallic compound allows multiple back-to-back bonds to be performed using the same metal bond composition and temperature. For example, the cap 60 can be bonded to the CMOS wafer 16 using the very same TLP process and composition used to perform the CMOS-sensor wafer bond. A number of different metal compositions can be used for TLP, including Au—In, Au—Sn, and Ni—Sn whose bond temperatures are all below 380° C. and are therefore compatible with post-CMOS processing.

The final preferred processing step is to conduct a silicon DRIE at the backside (handle layer 38) of the sensor wafer 30 to define the proof mass 14. Suitable patterning techniques are well known in the art and therefore will not be discussed in any detail here. Final release of the proof mass 14 is completed by a blanket dry etching (RIE) of the exposed buried oxide layer 40 everywhere except areas masked by the proof mass 14, to yield the structure shown in FIG. 11. According to a preferred aspect of the invention, preferably all processing steps described above are low temperature and compatible with deep-submicron CMOS. In addition, all etching steps are preferably dry etch processes to avoid stiction and enhance the fabrication yield.

Figure 12:
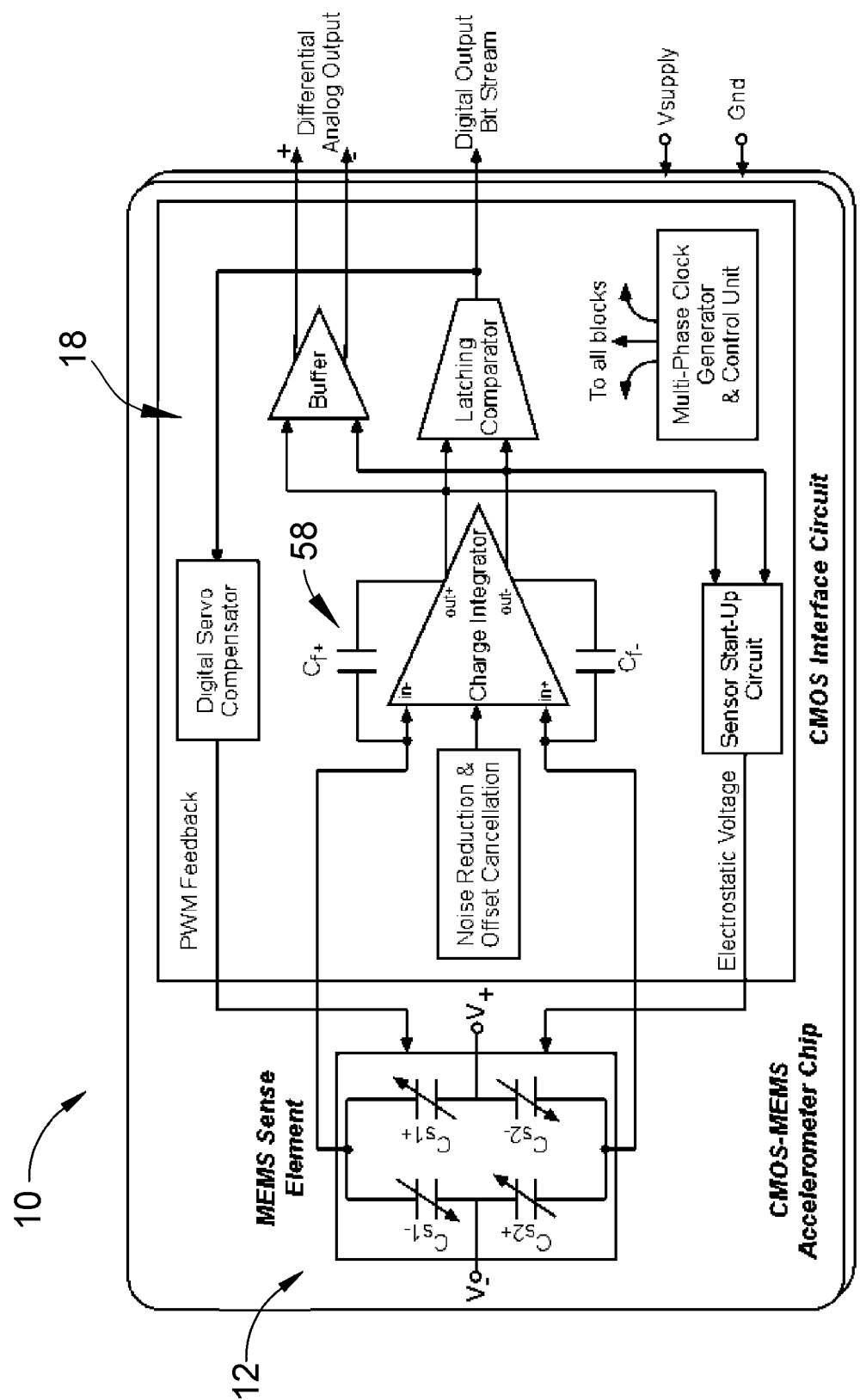
FIG. 12 is a simplified block diagram of the accelerometer and interface circuit of FIG. 1.
Figure 13:
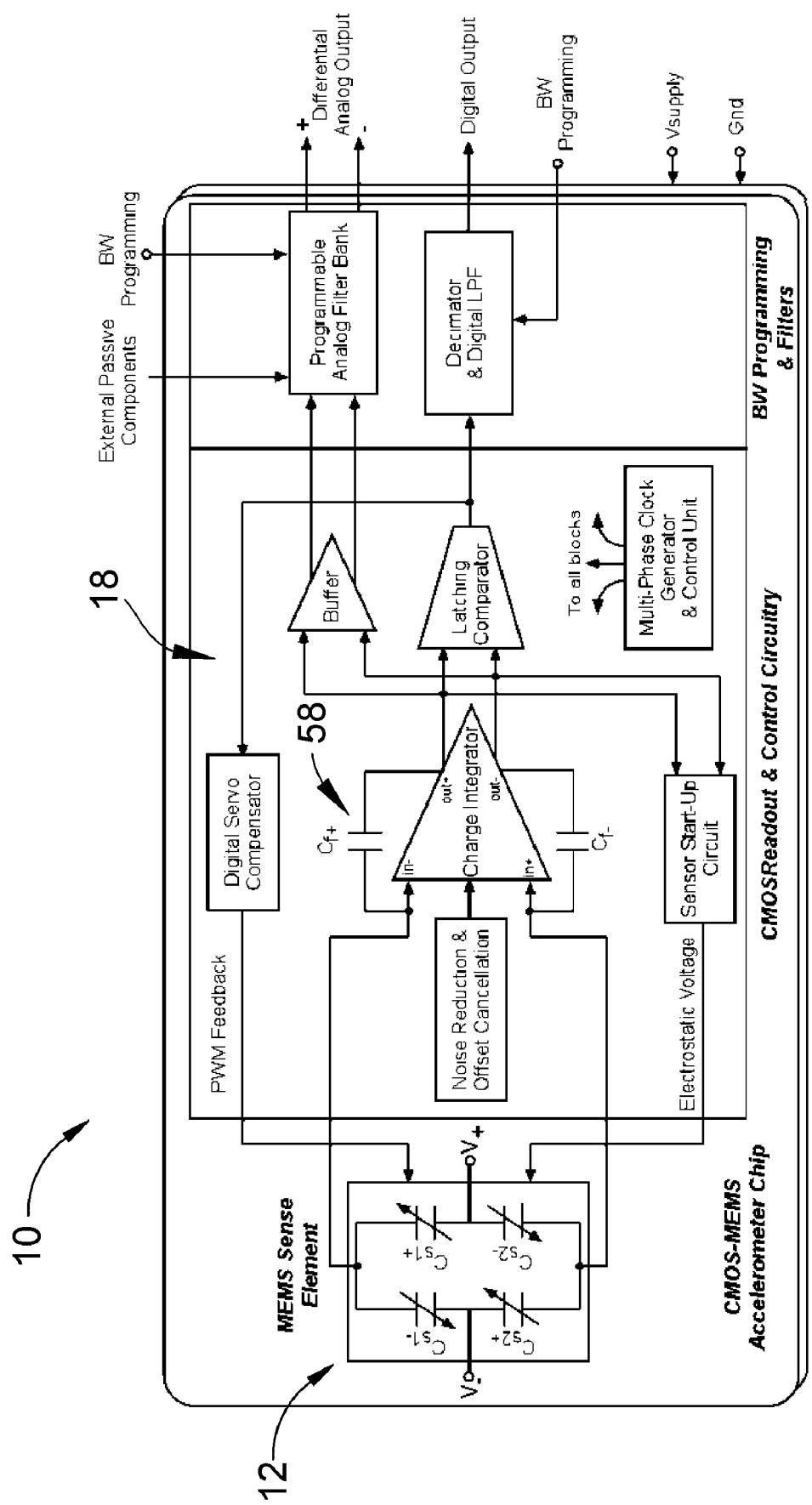
FIG. 13 is a simplified block diagram of the accelerometer and interface circuit with programmable output bandwidth.
Figure 14:
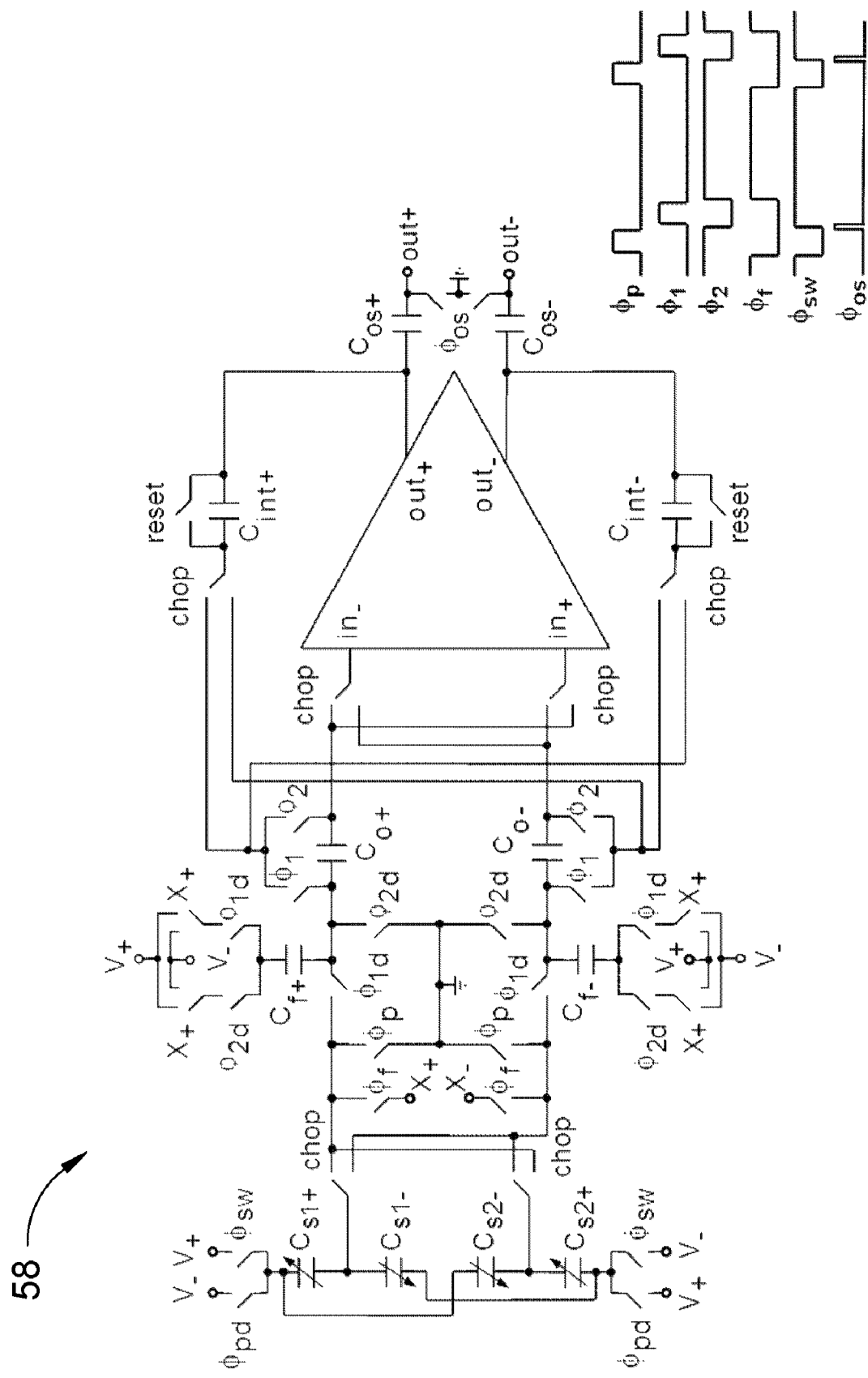
FIG. 14 is a schematic of a low-noise capacitance readout front-end circuit for use with the accelerometer and interface circuit of FIG. 1.

The interface circuitry 18 of this invention is discussed in reference to FIGS. 12 through 14. The interface circuitry 18 preferably provides a differential analog readout of the capacitance change for a sensor device 10. The interface circuitry 18 further provides the ability to simultaneously read the capacitance, apply feedback, and provide direct digital output for a Type B sensor device 10 having higher bandwidth and linearity specifications, as well as a higher noise budget. FIG. 12 shows a simplified block diagram of the sensor device 10, sensing element 12, and interface circuitry 18. The circuitry 18 can be used both in open-loop and closed-loop modes of operation. In closed-loop mode, the circuitry 18 forms a second order electromechanical sigma-delta modulator with the sensor device 10, resulting in force-feedback and direct digital output. A preferred readout front-end circuit 58 (FIG. 14) is a fully differential switched-capacitor (SC) charge integrator with active offset and 1/f noise cancellation. A particularly advantageous aspect of the invention is that the offset and 1/f noise cancellation are shown in FIG. 14 as being achieved with multi-pass correlated double sampling (CDS) at input and output, in combination with chopper stabilization for switch residual mismatch cancellation (discussed below). CDS also compensates the front-end amplifier finite gain. A fully-differential configuration reduces errors due to switches and noise on power rails that appear as common mode, and also doubles the input sensitivity and dynamic range and cancels even harmonics. A sampling clock greater than 100 kHz and a small charge integration interval (about 1 to 3 μsec) in each clock phase is believed needed for the front-end circuit 58 in order to both reduce the charge leakage of the circuit capacitors ($C_{s1+}$, $C_{s1-}$, $C_{s2+}$, $C_{s2-}$) and provide a sufficient oversampling ratio for feedback and digital data conversion. Note that charge leakage of the capacitors is temperature dependent and has to be minimized to satisfy temperature and long-term gain stability requirements of the accelerometer. FIG. 13 is a block diagram for an alternative interface circuitry 18 that supports programmable output bandwidth and integrates the oversampled sigma-delta modulator decimation filter as well.

In order to be able to clock the circuitry 18 sufficiently fast, switches in the charging path of the sensor large capacitances cannot be minimum size. This in return increases any residual offset due to the mismatches of the switches and their charge injection, and reduces the dc response precision. Therefore, the circuitry 18 is shown as also employing switch chopper-stabilization to cancel the offset caused by switch mismatches, and thus enhances the overall accelerometer quasi-static response. As used herein, the term chopper stabilization broadly encompasses the technique of alternating switches and their associated signal paths in a fully-differential readout circuit configuration to cancel any offset or near-dc errors caused by the mismatch of the switches connected to the signal path, and is known and particularly effective for use in switched-capacitor circuits. The circuitry 18 also includes a digital servo compensator that employs pulse width modulation (PWM) to implement phase-lead compensation. The circuitry 18 is also shown as including a sensor start-up circuit that is activated at power down or recovery from over-range input. The circuitry 18 supplies additional electrostatic force in these cases and minimizes the supply voltage (Vsupply) requirements, which is typically desirable in consideration for the overall chip dynamic range and needed electrostatic force.

The integrated CMOS-MEMS sensor device 10 of this invention offers higher resolution due to its integrated process and lower parasitics. In addition to the reduced input parasitics achieved with the vertical integration of the sensing element 12 and integrated circuitry 18, the readout resolution of the circuitry 18 can be further increased by increasing the sampling rate. The lower parasitics also help with increasing the sampling clock by reducing the node capacitances. In the SC circuits the dominant noise source is kT/C noise of the charge integration capacitor (which is typically the smallest capacitor affected by this noise source), and is due to sampling and aliasing the wide-bandwidth thermal noise of the circuit switches. kT/C noise cancellation is obtained with the output CDS noted above as part of the combination of multipass CDS and chopper stabilization.

FIG. 14 shows the schematic for the preferred readout front-end circuit 58. In this circuit topology the dominant noise source becomes the sampled amplifier noise, which is significantly lower. The output CDS is implemented by adding capacitors $C_{os+}$ and $C_{os-}$ that sample $C_{int}$ noise in clock phase ($\phi_{os}$), and consequently deduct $C_{int}$ noise from the output. The circuit 58 utilizes switch chopper stabilization by alternating the switches at the high impedance nodes between the two differential signal paths. The front-end circuit 58 has three main clock phases: in the precharge phase ($\phi_{os}$), the capacitive bridge is charged to the rails; in the charge integration phase ($\phi 1$), the capacitive bridge is charged in the reverse direction and a packet of charge proportional to the sense capacitors difference is integrated on the feedback capacitors ($C_{int}$); in the feedback phase ($\phi f$), the capacitive bridge is disconnected from the integrator input and electrostatic feedback bit is applied (closed-loop mode of operation).

FIGS. 15 through 18 pertain to a packaging processes for the sensor device 10. In FIGS. 15 through 17, the sensor device 10 is encapsulated at wafer-level using a silicon cap 60 to provide protection from the environment prior to die singulation and handling. The sealed cap 60 also isolates the sensor device 10 from its operating environment, and can also provide isolation or protection from the ambient humidity and pressure variations. Finally, the silicon cap 60 and CTE matching can be effective in reducing thermal stresses in the device 10.

FIG. 15 represents a first step in the packaging process flow, in which bond metal stacks 62 are patterned and electroplated on a cap wafer 64. The wafer 64 is then patterned and a cavity etch performed while the bond metal stacks 62 are protected (not shown) to yield the cap 60 shown in FIG. 16. The cavity etch can be performed using wet anisotropic etching of silicon with (100) surface orientation to form the sloping sidewalls shown in FIG. 16, or by dry etching or wet etching of (110) silicon to produce a cavity with nearly vertical sidewalls capable of reducing overall die size. The cap 60 is then flipped, aligned to the CMOS wafer 16 and a seal bond is performed, e.g., using solder or glass frit bonding, TLP, or another suitable low-temperature bonding scheme as described previously, preferably at a temperature of less than 300° C. The resulting capped sensor 66 can then be diced and packaged similar to a standard IC chip. It is worth noting that the CMOS-MEMS integration technique provided by this invention simplifies the packaging operation, since all leads for the sensor device 10 are connected to the CMOS substrate 16 locally through the beams 32 and anchors 26, and no lead-transfer from the sensor device 10 to the exterior of the cap 60 is required.

FIG. 18 schematically represents a packaged sensor module 68 in which the capped sensor 66 is contained and represented as being wire-bonded to a module housing 70. The impact of the module housing 70 and its potential induced thermal stresses are preferably minimized, such as by appropriate choices of materials for the housing 70, for example, ceramics or other materials whose coefficients of thermal expansion (CTE) are approximately matched to silicon, and/or proper die bond materials and stress isolation techniques for die attachments as known in the art. Notably, the symmetrical construction of the device 10 and use of the folded beam design depicted in FIGS. 1 through 3 serve to reduce or cancel the effect of package stresses on the sensor performance.

Figure 19:
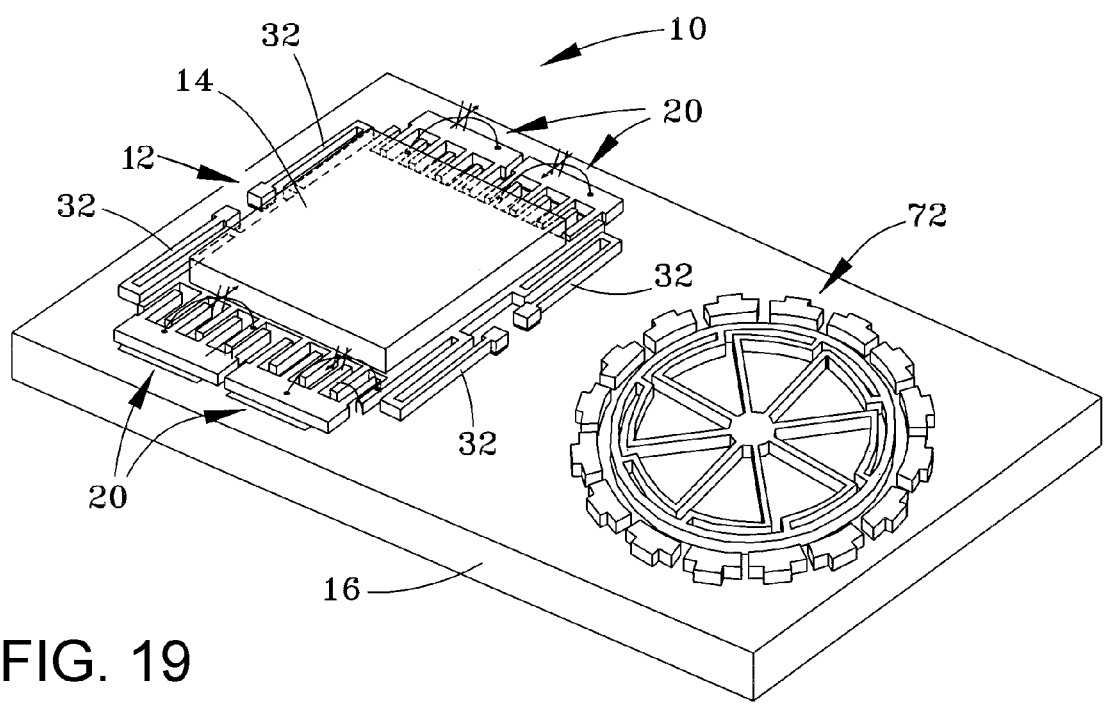
FIG. 19 schematically represents a perspective view of a sensor that includes the motion sensor of FIG. 1 combined with a z-axis gyroscope in accordance with an optional aspect of the present invention.
Figure 20:
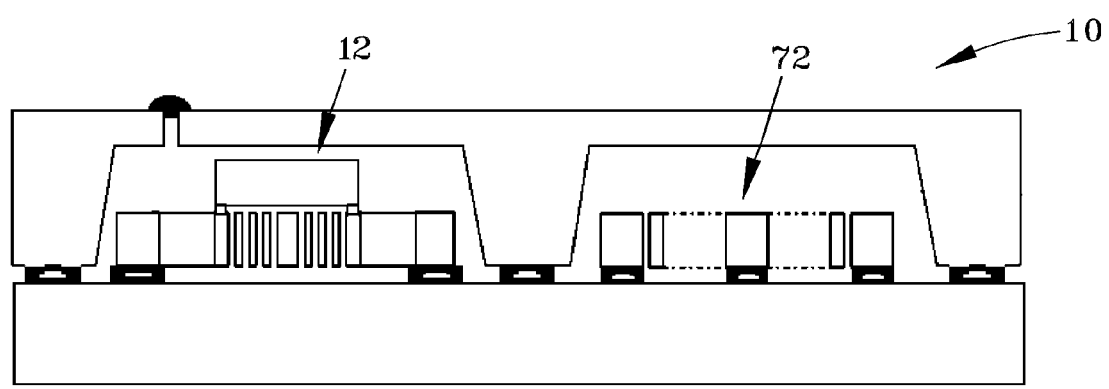
FIG. 20 represents a cross-sectional view of the sensor of FIG. 19.
Figure 21:
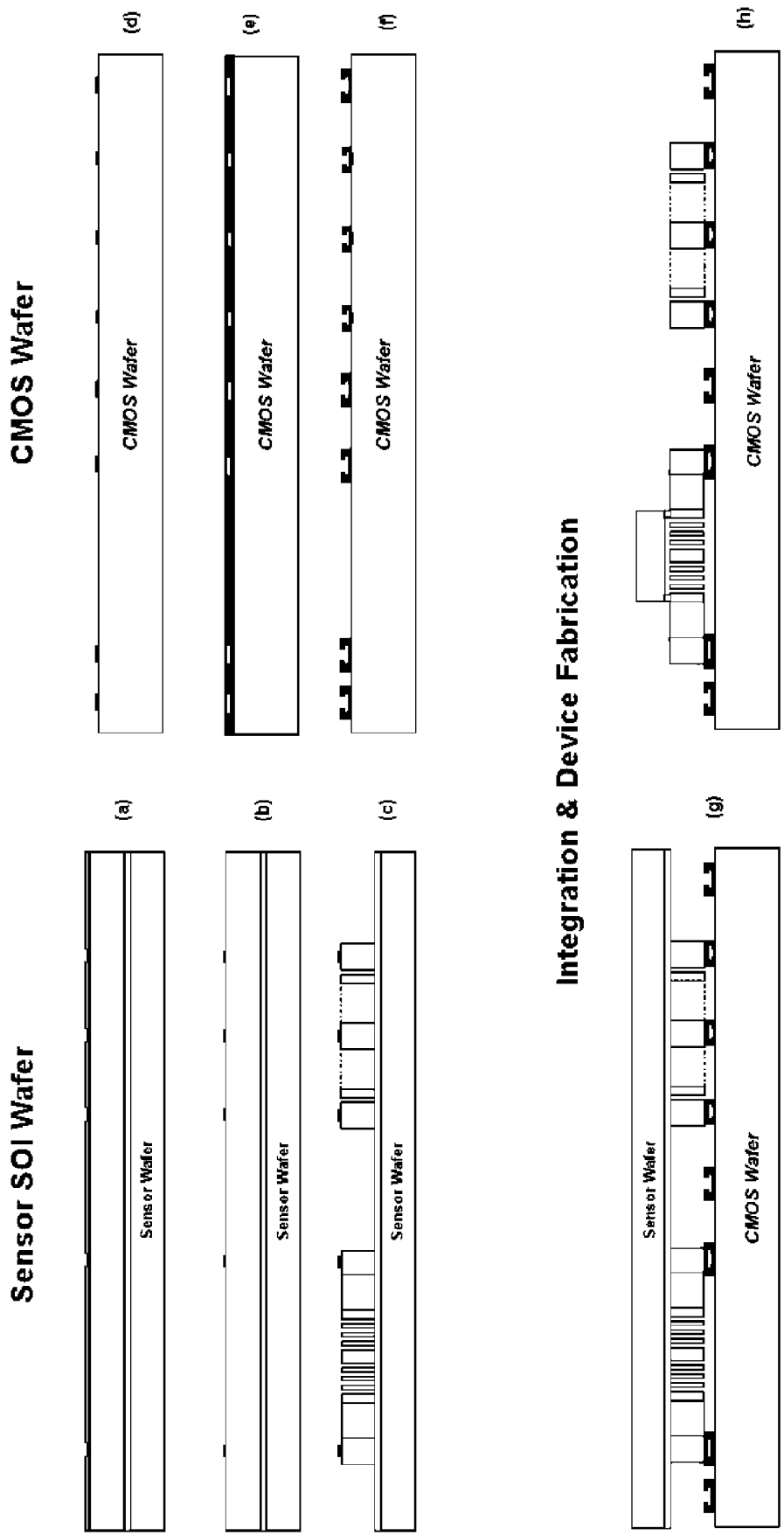
FIG. 21 represents steps in the fabrication of the sensor of FIGS. 19 and 20.

From the foregoing, it should be appreciated that the sensor device 10 represented in FIG. 1 can be combined on the same wafer with other MEMS devices. For example, FIGS. 19 and 20 schematically represent a sensor unit that includes the sensor device 10 of FIG. 1 combined with a z-axis gyroscope 72. Suitable steps in the fabrication of the sensor unit of FIG. 19 are represented in FIG. 21, and correspond to the processing steps depicted in FIGS. 4 through 11.

Figure 22:
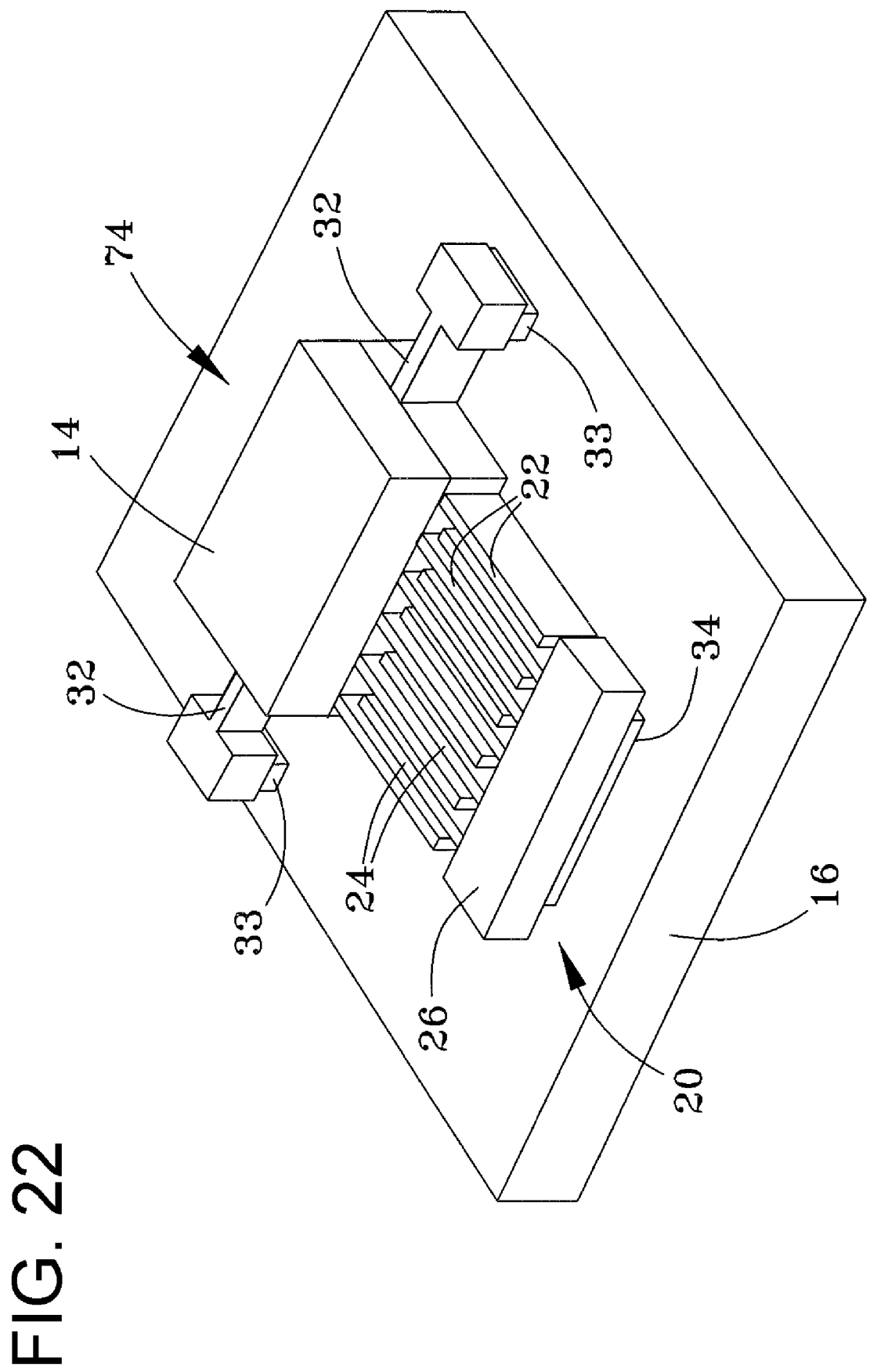
FIG. 22 schematically represents a perspective view of an alternative motion sensor in accordance with the present invention.

While the above discussion has been directed to the fabrication of a sensor device 10 with an in-plane axis of sensitivity, sensors with out-of-plane sensitivity are also within the scope of this invention, as evidenced by FIG. 22. Essentially the same processing steps used to produce the sensor device 10 of FIG. 1 can be used to produce the sensor device 74 of FIG. 22, whose primary components are numbered consistently with the corresponding components of the device 10 of FIG. 1.

Figure 23:
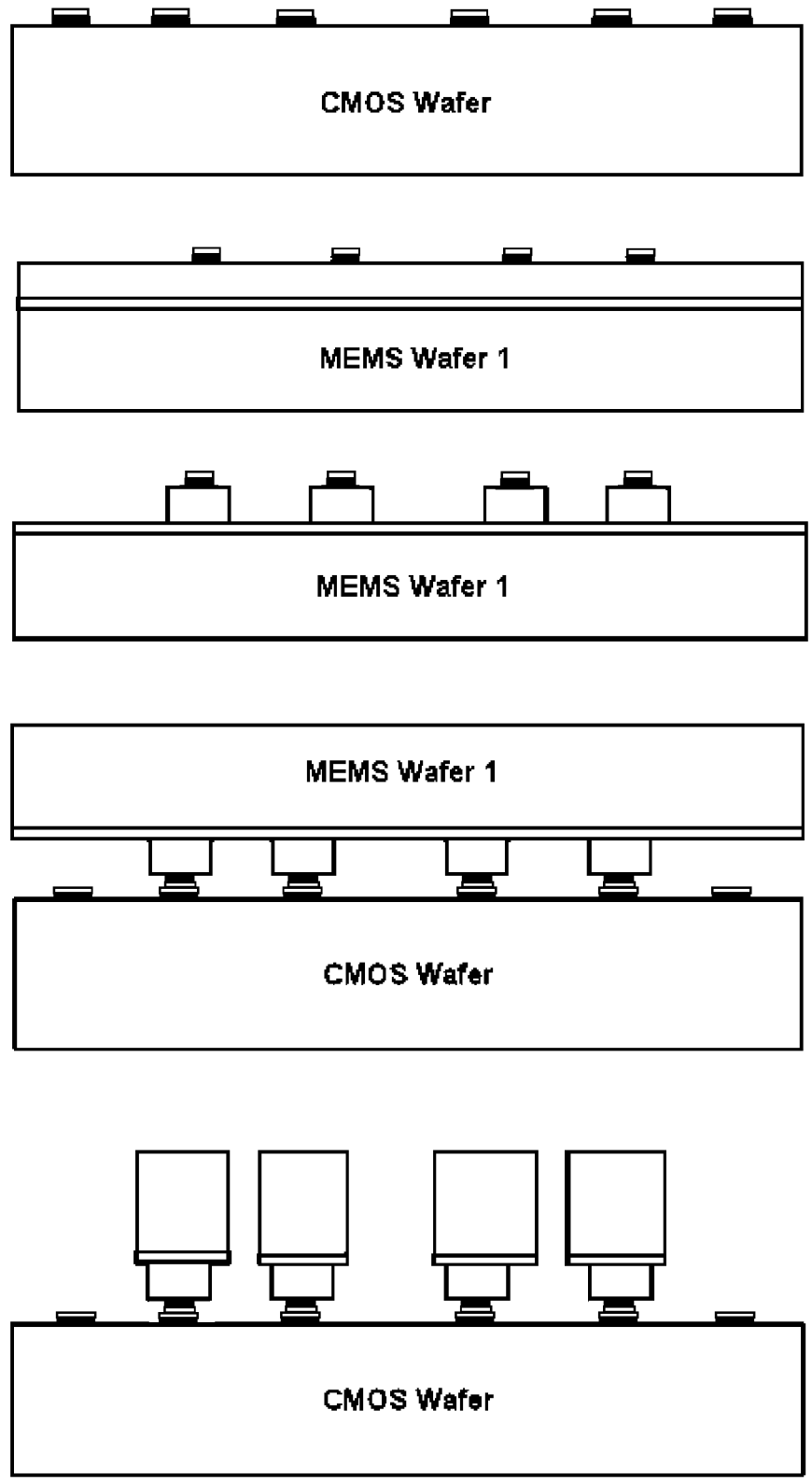
FIGS. 23 and 24 represent steps in a fabrication process for a multiple level sensor in accordance with a further aspect of the present invention.
Figure 24:
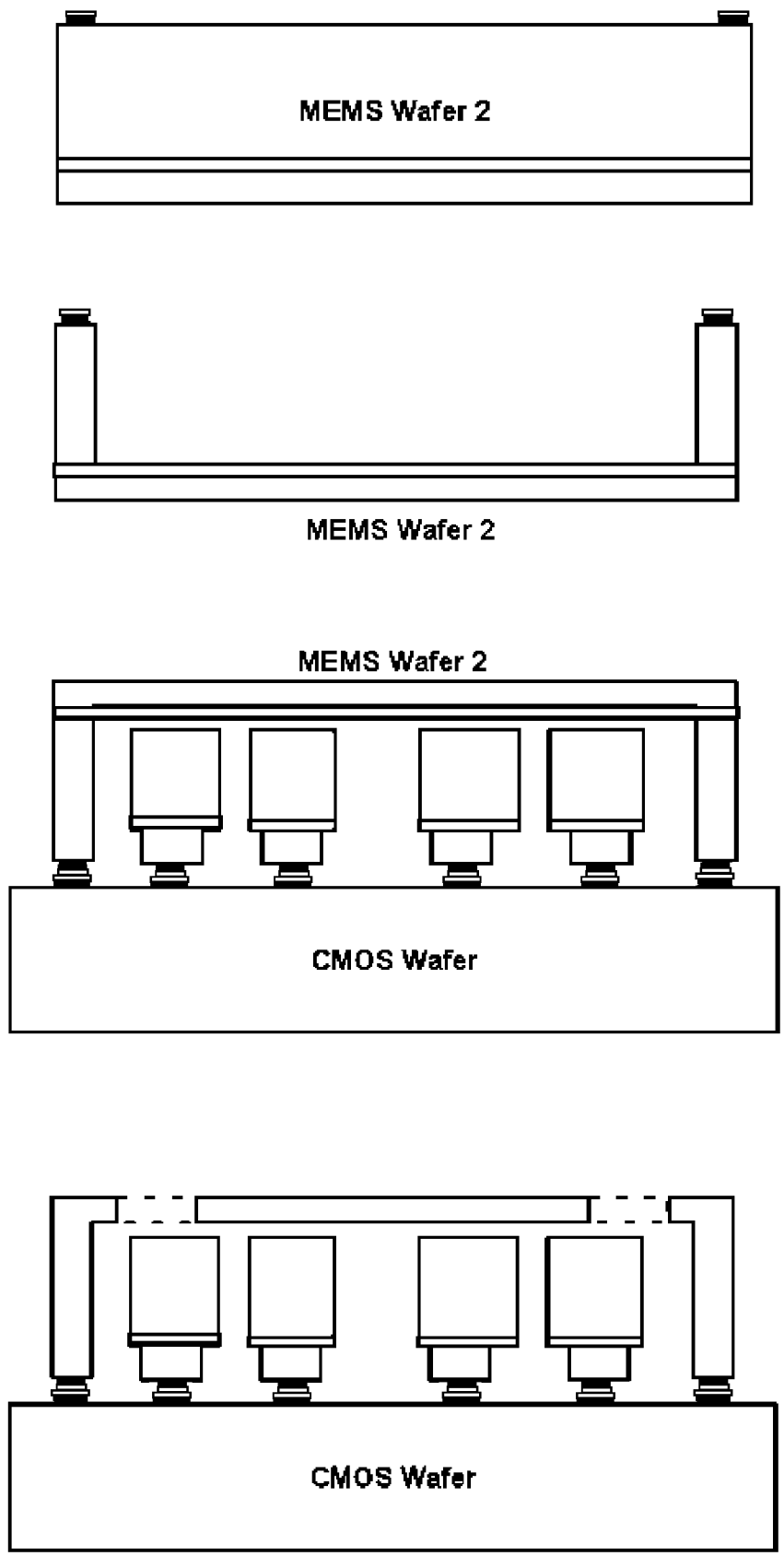
Figure 25:
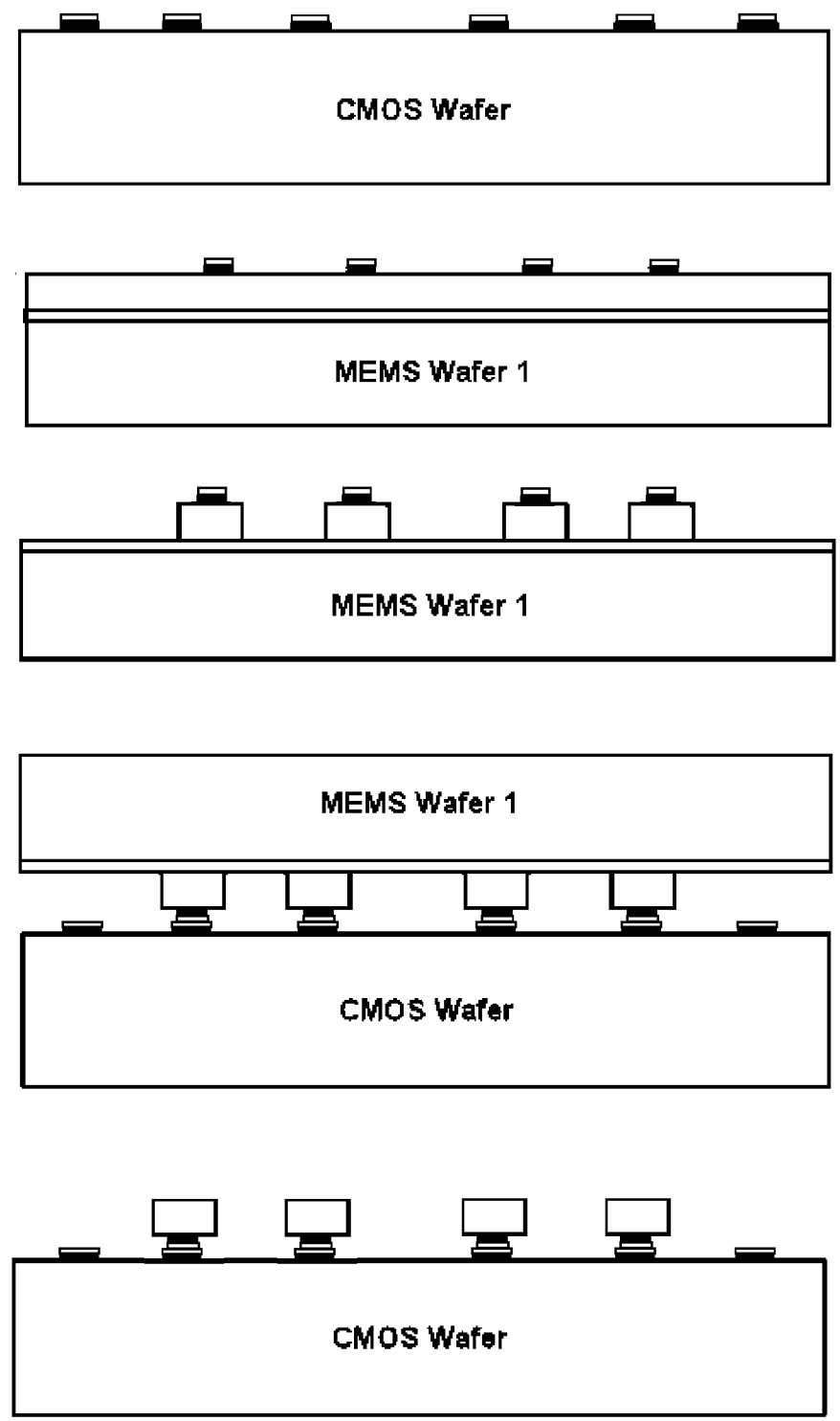
FIGS. 25 and 26 represent steps in another fabrication process for a multiple level sensor in accordance with the present invention.
Figure 26:
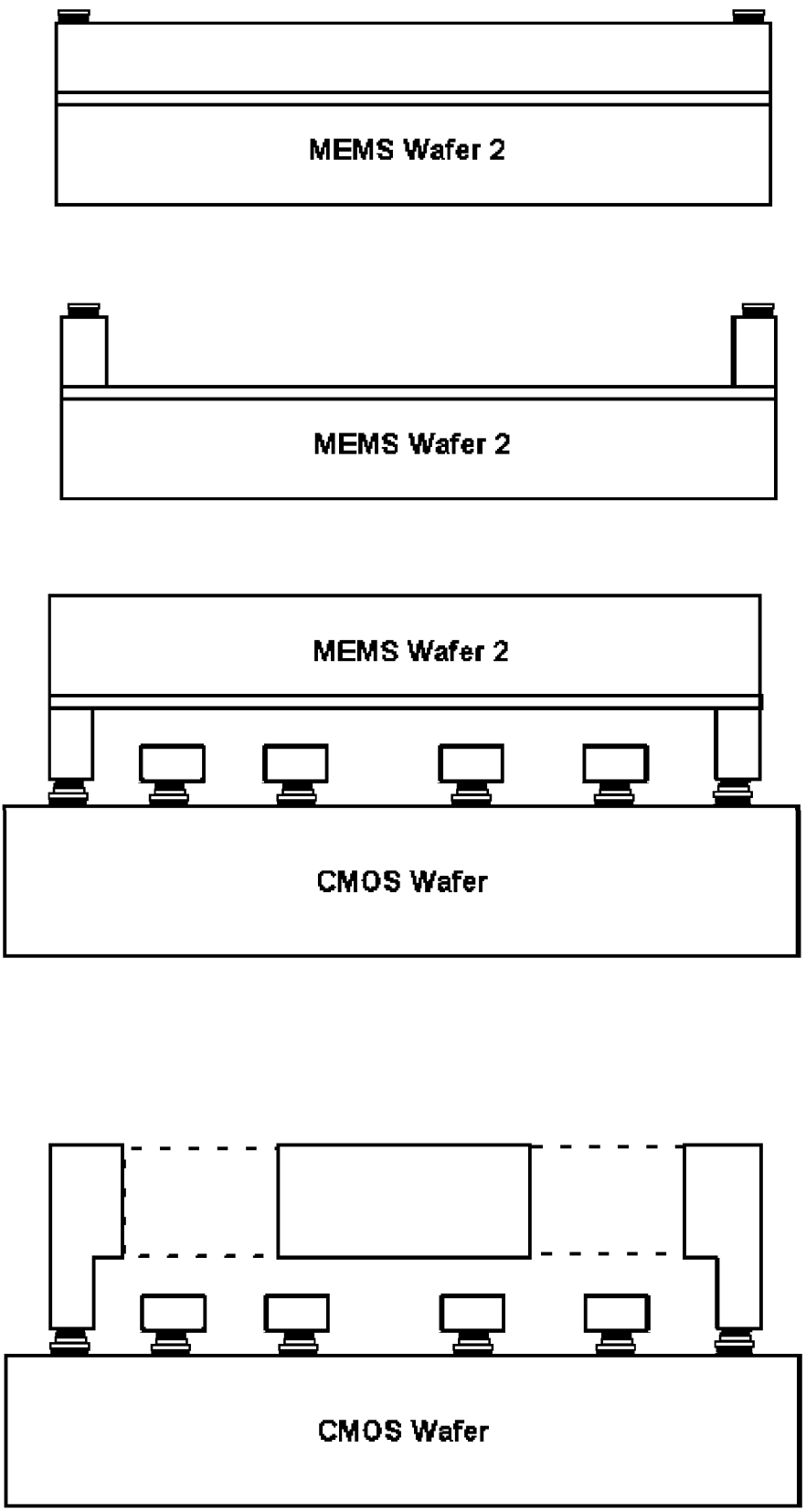

Finally, FIGS. 23 through 26 illustrate the extension of the present invention to multiple level sensor structures. In FIG. 23, sensor and CMOS wafers are processed generally in the same manner as that represented in FIGS. 4 through 11, and additional steps for fabricating and bonding a second sensor (MEMS) wafer to provide a second sensor level are represented in FIG. 24. Each sensor wafer is an SOI wafer, and the device and handle layers of each SOI wafer are present in their respective levels of the resulting multiple level sensor structure. FIG. 25 represents processing of a sensor wafer in which the handle layer of the original SOI wafer is completely removed, with the additional steps for fabricating and bonding a second sensor (MEMS) wafer represented in FIG. 26. Again, both sensor wafers are SOI wafers. In the resulting multiple level sensor structure, only the device layer remains of the first SOI wafer within the first sensor level, while both device and handle layers of the second SOI wafer are present in the second sensor level of the multiple level sensor structure. In each case, the final dry etch could be eliminated, depending on the type of sensor being fabricated.

While the invention has been described in terms of a preferred embodiment, it is apparent that other forms could be adopted by one skilled in the art. For example, the physical configuration of the sensing device could differ from that shown, and materials and processes other than those noted could be use. Therefore, the scope of the invention is to be limited only by the following claims.

The invention claimed is:

1. A micromachined sensor having a capacitive sensing structure comprising:
    a first substrate comprising first and second conductive layers and a buried insulator layer separating the first and second conductive layers;
    a member defined by the first and second conductive layers and the buried insulator layer of the first substrate;
    a first set of elements defined with the first conductive layer of the first substrate and connected to the member, the first set of elements comprising at least first, second, third and fourth elements that are electrically isolated from each other by the buried insulator layer within the member;
    a second set of elements defined with the first conductive layer, the set of elements comprising at least first, second, third, and fourth elements that are and capacitively coupled with the first, second, third, and fourth elements, respectively, of the first set of elements with gaps therebetween, the capacitive couples generating capacitive outputs that vary with changes in the gaps, the first, second, third, and fourth elements of the first and second sets of elements define a symmetric capacitive full-bridge structure; and
    a second substrate bonded to the first substrate so that the member and the first set of elements are movably supported above the second substrate, the second set of elements are anchored to the second substrate, and the first and second sets of elements are physically interconnected only through the second substrate;
    wherein the member is movable in a first direction to cause the gaps of the capacitive couples of the first and third elements of the first and second sets of elements to increase and the gaps of the capacitive couples of the second and fourth elements of the first and second sets of elements to decrease.

2. The micromachined sensor according to claim 1, further comprising electrical connections associated with the first and second sets of elements.

3. The micromachined sensor according to claim 2, wherein the second substrate comprises circuitry electrically connected to the first and second sets of elements through the electrical connections.

4. The micromachined sensor according to claim 3, wherein the circuitry is CMOS interface circuitry.

5. The micromachined sensor according to claim 4, wherein the CMOS interface circuitry comprises means for performing multiple correlated double sampling of input thereto and output thereof.

6. The micromachined sensor according to claim 5, wherein the CMOS interface circuitry further comprises means for performing chopper stabilization that reduces dc and low-frequency noise and drift.

7. The micromachined sensor according to claim 4, wherein the CMOS interface circuitry operates in a closed-loop mode.

8. The micromachined sensor according to claim 4, wherein the CMOS interface circuitry operates in an open-loop mode.

9. The micromachined sensor according to claim 1, wherein the first, second, third and fourth elements of the first set of elements are part of first, second, third and fourth groups, respectively, of the first set of elements, the first, second, third and fourth elements of the second set of elements are part of first, second, third, and fourth groups of elements that are interdigitated and capacitively coupled with the first, second, third, and fourth groups of elements, respectively, of the first set of elements, and the first, second, third, and fourth groups of elements of the first and second sets of elements define the symmetric capacitive full-bridge structure.

10. The micromachined sensor according to claim 9, wherein the elements within each group of the first set of elements are electrically connected to each other, and the elements within each group of the second set of elements are electrically connected to each other.

11. The micromachined sensor according to claim 9, further comprising at least one trench defined in the first conductive layer so that the buried insulator layer electrically isolates the first, second, third, and fourth groups of the first set of elements.

12. The micromachined sensor according to claim 9, wherein the first and second groups of the first set of elements extend from a first edge of the member and the third and fourth groups of the first set of elements extend from an oppositely-disposed second edge of the member.

13. The micromachined sensor according to claim 1, further comprising means for supporting the member and the first set of elements above a surface of the second substrate so as to permit bidirectional motion of the member in a plane parallel to the surface of the second substrate.

14. The micromachined sensor according to claim 13, wherein the supporting means comprises a plurality of beams at opposite ends of the member.

15. The micromachined sensor according to claim 14, further comprising circuitry on the second substrate and electrically connected to the first set of elements through the plurality of beams.

16. The micromachined sensor according to claim 1, wherein the symmetric capacitive full-bridge structure directly interfaces with a fully-differential readout front-end circuit without reference capacitors for the capacitive outputs of the capacitive couples.

17. The micromachined sensor according to claim 1, wherein the micromachined sensor is a motion sensor and the member is a proof mass of the motion sensor.

18. The micromachined sensor according to claim 1, wherein the micromachined sensor comprises at least a second sensing structure supported on the second substrate.

19. The micromachined sensor according to claim 1, wherein the first, second, third, and fourth elements of the first set of elements are electrically isolated from each other within four symmetrical quadrants on the first substrate by the buried insulator layer.

20. A micromachined sensor having a capacitive sensing structure comprising:
    a member comprising first and second conductive layers and a buried insulator layer separating the first and second conductive layers;
    a first set of elements defined with the first conductive layer, the first set of elements comprising at least first, second, third and fourth elements that are electrically isolated from each other on the member by the buried insulator layer; and a second set of elements comprising at least first, second, third, and fourth elements that are capacitively coupled with the first, second, third, and fourth elements, respectively, of the first set of elements through gaps therebetween so that the capacitive couples generate capacitive outputs that vary with changes in the gaps, the first, second, third, and fourth elements of the first and second sets of elements defining a symmetric capacitive full-bridge structure;

wherein the member is movable in a first direction to cause the gaps of the capacitive couples of the first and third elements of the first and second sets of elements to increase and the gaps of the capacitive couples of the second and fourth elements of the first and second sets of elements to decrease.

21. The micromachined sensor according to claim 20, further comprising electrical connections associated with the first and second sets of elements.

22. The micromachined sensor according to claim 21, further comprising a substrate on which the sensing structure is supported and to which the second set of elements is anchored, the substrate comprising circuitry electrically connected to the first and second sets of elements through the electrical connections.

23. The micromachined sensor according to claim 22, wherein the circuitry is CMOS interface circuitry.

24. The micromachined sensor according to claim 23, wherein the CMOS interface circuitry comprises means for performing multiple correlated double sampling of input thereto and output thereof.

25. The micromachined sensor according to claim 24, wherein the CMOS interface circuitry further comprises means for performing chopper stabilization that reduces dc and low-frequency noise and drift.

26. The micromachined sensor according to claim 23, wherein the CMOS interface circuitry operates in a closed-loop mode.

27. The micromachined sensor according to claim 23, wherein the CMOS interface circuitry operates in an open-loop mode.

* * * * *